United States Patent [19]
Matsui et al.

[11] Patent Number: 5,450,040
[45] Date of Patent: Sep. 12, 1995

[54] GAUSSIAN-BEAM OSCILLATOR FOR MICROWAVE AND MILLIMETER WAVES

[75] Inventors: Toshiaki Matsui, Tokyo; Masahiro Kiyokawa, Mushashi-Murayama, both of Japan

[73] Assignee: Communications Research Laboratory, Ministry of Posts and Telecommunications (Japanese Government), Tokyo, Japan

[21] Appl. No.: 290,076

[22] Filed: Aug. 12, 1994

[30] Foreign Application Priority Data

Feb. 14, 1994 [JP] Japan .................................. 6-039184

[51] Int. Cl.⁶ .......................... H03B 5/18; H03B 7/14
[52] U.S. Cl. .................... 331/96; 331/107 DP; 331/107 SL; 331/107 S
[58] Field of Search ................... 331/56, 96, 107 DP, 331/108 D, 107 SL, 107 S, 96, 132

[56] References Cited
U.S. PATENT DOCUMENTS

| | | | |
|---|---|---|---|
| 4,496,913 | 1/1985 | Wandinger et al. | 331/56 |
| 4,742,314 | 5/1988 | Mink | 331/96 X |
| 4,906,945 | 3/1990 | Mizuno et al. | 331/96 |
| 5,379,110 | 1/1995 | Matsui et al. | 356/445 |

Primary Examiner—David Mis
Attorney, Agent, or Firm—Oblon, Spivak, McClelland, Maier & Neustadt

[57] ABSTRACT

A Gaussian-beam oscillator for microwave and millimeter wave comprising a negative resistance amplifier circuit which produces and amplifies a high-frequency signal, a resonator consisting of a pair of reflecting mirrors, which consist of a spherical mirror and a planar mirror or two spherical mirrors, and a wave path which transmits the high-frequency signal between said resonator and said negative resistance amplifier circuit, one reflecting mirror of said resonator having an electromagnetic wave coupling region constituted as a circular partially transparent mirror surface region having its center on the optical axis, the other reflecting mirror having a strip element provided at the center of the optical axis and on the rear surface of said strip element having a coupling region for coupling with said wave path, said one reflecting mirror constituting said resonator and having the electromagnetic wave coupling region having a higher reflectance than the reflectance of the other reflecting mirror.

19 Claims, 16 Drawing Sheets

GAUSSIAN-BEAM OSCILLATOR FOR MICROWAVE AND MILLIMETER WAVES

BACKGROUND OF THE INVENTION

1. Field of the Invention

This invention relates to a Gaussian-beam oscillator for microwave and millimeter wave which realizes microwave-millimeter wave oscillation with high spectral purity that can be directly extracted as beam output and, in addition, wave front synthesizes the outputs of a plurality of oscillator devices in a resonator to realize high-efficiency power combining.

2. Description of the Prior Art

For frequency-stabilization and phase noise reduction of a high-frequency oscillation output, the method of producing the oscillation coupled with a high-Q-value resonator is ordinarily used and, in particular, a planar circuit oscillator that ms a transistor circuit combined with a dielectric resonator (DRO) is widely used in the quasi-micro-microwave region. On the other hand, in the millimeter wave region, the conventional oscillators using a waveguide mount are still currently used, and since these ordinarily use a square or cylindrical resonator of the type with a partitioned waveguide, the Q value is low, so that a high-quality oscillation spectrum cannot be anticipated in combination with a millimeter wave transistor with a broad gain region. Attempts have been made to extend the use of the dielectric resonator employed in the microwave region into the millimeter wave region. However, the problem of decreasing resonator Q value with shorter wavelength is similarly present, and a need has arisen for new high-Q-value resonator technology suitable for combination with microwave and millimeter wave planar circuits, which are expected to spread and develop from now on.

In addition, in the millimeter wave and higher frequency range, since the output of an individual oscillator device is limited in principle, technology for power-combining the outputs of a plurality of oscillator devices is necessary for obtaining a large output, and in recent years experiments have been conducted using the Fabry-Perot resonator for this power combining. There has been reported a system in which, in the interior of a Fabry-Perot resonator having a set of facing plane-parallel mirrors or planar mirrors, a semiconductor device or a superconducting Josephson device was two-dimensionally disposed inside the resonator. It is considered, however, that problems exist in oscillator fabrication technology, including resonator technology, with the power combining efficiency obtained experimentally being low and the situation at present being one limited to basic experiments relating to power combining.

The idea of disposing an amplifying device inside a Fabry-Perot resonator can also be considered a method that analogously utilizes laser oscillation technology employing the light amplifying effect of induced discharge. With electric waves of a high frequency at or above microwaves, there are many cases in which it is convenient to treat them as beams similar to light, and, in particular, quasi-optical technology has an extremely important role to play in the millimeter wave region.

As a laser resonator using a combination of spherical mirrors, the Fabry-Perot resonator was intensively researched in the 1960s and has been established as an optical technology. In respect of electric waves of a frequency at or below near-millimeter waves (submillimeter waves in the several hundred GHz region), whose wavelengths are more than a number of three ciphers longer than light, however, this being a technology region on the border between optical technology and microwave technology, the sector of technology for connection and mutual transformation between the wave path technology from microwave technology and the beam technology from optical technology has many unsolved problems, while, moreover, microwave circuit technology, which has developed to a high level, is difficult to technically extend, as it is, for realization of a high-performance oscillator, so that a new technology for organically integrating optical beam technology and microwave and millimeter oscillator circuit technology has become important.

In the technologies mentioned in the foregoing, there are no concepts for realizing a microwave and millimeter wave oscillator which is appropriate for integral configuration with the modulation circuits, control circuits and other auxiliary circuits required in telecommunication and measurement technology and by connection with a high-Q-value resonator stabilizes frequency and reduces phase noise and which simultaneously enables the oscillation output to be extracted as a beam output With low sidelobe, and it is difficult to realize a compact and lightweight transmitter by combining these technologies. This adaptability to integral configuration with auxiliary circuits is, together with the microwave and millimeter wave monolithic integrated circuit (MMIC) technology now being actively developed, important for the realization of a compact, lightweight and practical transmitter. With the prior art power combining technology used in the case where it is necessary to amplify microwave and millimeter wave oscillation output, moreover, since the amplifying device is disposed inside the resonator, very major restrictions arise regarding connection with the modulation circuits, control circuits and various other auxiliary circuits which are a practical requirement for telecommunication, measurement and the like simultaneously with power combining, and because of these many problem points in application there is desired new microwave and millimeter wave oscillator configuration technology.

The present invention was accomplished in the light of the foregoing circumstances and resides in the provision of a new beam oscillator for microwave and millimeter wave with important characteristics as a practical technology, which utilizes a high-Q-value resonator technology applicable in the microwave and millimeter wave region, is able to stabilize oscillation frequency and reduce phase noise, oscillates directly in the linear polarization or circular polarization mode and enables the oscillation output to be extracted as a beam output with low sidelobe, and, further, is efficiently combinable with auxiliary circuits for various low speed~high speed modulation circuits and control that are indispensable for utilization with telecommunication technology and measurement technology, is suitable for integration with millimeter wave monolithic integrated circuits (MMIC) and the like, can enable realization of a quasi-planar transmitter, and can be augmented with high-efficiency power combining capability in cases where amplification of the oscillation output is necessary.

SUMMARY OF THE INVENTION

This invention provides an oscillator comprising a negative resistance amplifier circuit which produces and amplifies a high-frequency signal, a resonator consisting of a pair of reflecting mirrors, which consist of a spherical mirror and a planar mirror or two spherical mirrors, and a wave path which transmits the high-frequency signal between said resonator and said negative resistance amplifier circuit, one reflecting mirror of said resonator having an electromagnetic wave coupling region constituted as a circular partially transparent mirror surface region having its center on the optical axis, the other reflecting mirror having a strip element provided at the center of the optical axis and on the rear surface of said strip element having a coupling region for coupling with said wave path, said one reflecting mirror constituting said resonator and having the electromagnetic wave coupling region having a higher reflectance than the reflectance of the other reflecting mirror.

In addition, in the aforesaid oscillator, the circular partially transparent mirror surface region provided on the reflective mirror surface of one of said pair of reflecting mirrors as an electromagnetic wave coupling region coupling with free space is a reflective mirror surface consisting of a two-dimensional grid-like conductor pattern that is fine in comparison with the wavelength, the rear surface of the strip element constituting a region of the other reflective mirror surface is provided thereon with a coupling region for coupling with the wave paths of high-frequency signals corresponding to two perpendicularly intersecting polarization components, said coupling region is connected with two wave path systems, the electrical length between said coupling region and the branch point where the two wave path systems are transformed into a single wave path is the length which creates a 90 degree difference in the phase angle between the high-frequency signals of said two systems, and comprising the negative resistance amplifier circuit connected to said wave path.

Moreover, the configuration is such that the aforesaid pair of reflecting mirrors forms said resonator, a conductor reflecting mirror surface of the other reflecting mirror facing the one reflecting mirror provided with the circular partially transparent mirror surface region having its center on the optical axis of said resonator is provided with a plurality of strip elements constituting regions of its reflective mirror surface and on the rear side of each said strip element with a coupling region for coupling with a high-frequency signal wave path, a negative resistance amplifier circuit being connected with each said wave path, and the electrical lengths to the respective negative resistance amplifier circuits connected through said strip elements, coupling regions and wave paths being mutually equal.

In addition, the aforesaid resonator has a structure equivalent to that where a low-loss dielectric is charged between said pair of reflective mirror surfaces.

In addition, the aforesaid resonator has a configuration which varies and maintains the interval between said pair of reflecting mirrors.

In addition, the aforesaid oscillator is provided with a mechanism which maintains the reflecting mirror interval of the resonator formed by said pair of mirrors and a wave path which is magnetically coupled with said resonator, and is provided with a mechanism which varies the reactance component of said wave path.

In addition, the coupling region provided on said one reflective mirror surface for coupling with the high-frequency wave electromagnetic field wave path is a coupling with one of a metallic waveguide, a coaxial transmission path, a strip line and a coplanar planar wave path.

In accordance with the oscillator of the aforesaid configuration, the high-frequency signal from the negative resistance amplifier circuit transmitted by the wave path passes through the coupling region for coupling with the wave path of the high-frequency signal which is provided on the rear surface of the conductor reflecting mirror surface region (the strip element) and constitutes one of the reflective mirror surface regions, induces high-frequency current in the strip element constituting said one reflective mirror surface region, said high-frequency current on said strip element is radiated within the resonator constituted by disposing the pair of reflecting mirrors consisting of a spherical mirror and a planar mirror to face each other so that the waves reflected from the two mirror surfaces repeatedly superimpose, with respect to the high-frequency signal component which, among the slightly amplified high-frequency signal components from said negative resistance amplifier circuit, causes the interval between said pair of reflective mirror surfaces to produce a phase difference that is an integral multiple of $2\pi$, a stable electric field distribution is formed along the axis by the light focusing action of the spherical mirror, a resonant mode is excited which is manifested as a Gaussian beam in which the energy distribution of the electromagnetic waves is high near the center axis in the direction of electromagnetic wave propagation and decreases rapidly with separation from such axis (fundamental mode $TEM_{00q}$; q being an integer indicating the longitudinal mode number), in the initial stage of oscillation a weak reflected wave from the interior of the resonator returns to the negative resistance amplifier circuit along a path reverse to that of the coupled input to said resonator and is amplified and again transmitted through the wave path to couple with the resonator through the coupling region, the electromagnetic field amplitude inside the resonator is increased by repeating this amplification feedback loop, the amplification gain by the negative resistance decreases with growth of the electromagnetic field amplitude to cause a constant amplitude oscillation state, the high-frequency wave electric power accumulated inside the resonator is released from the circular partially transparent mirror surface region which is provided on the other reflective mirror surface forming said resonator and constitutes an electromagnetic wave coupling region for coupling with free space and is radiated into space in the form of a Gaussian beam, and since the apertured surface power distribution is Gaussian or in the form with the center portion thereof cut away, it is a microwave and millimeter wave oscillator with low sidelobe characteristics.

According to the beam oscillator for microwave and millimeter wave of the aforesaid configuration, moreover, it is possible to simultaneously excite two mutually perpendicular polarization components and set the phase angle between the perpendicular polarization components at 90 degrees, at which time a clockwise or counterclockwise circularly polarized wave is selectively excited depending on which of the perpendicular components advances at a phase angle of 90 degrees, whereby it is possible to realize a microwave and millimeter wave oscillator which radiates a circularly polarized beam output from a partially transparent mirror surface region constituted as a two-dimensional conducting grid pattern.

According to the beam oscillator for microwave and millimeter wave of the aforesaid configuration, moreover, the plurality of strip elements forming regions of one conductor reflective mirror surface constituting the resonator are excited in the same phase by the negative resistance amplifiers, whereby it is possible to realize highly efficient power combining in which the oscillations of the plurality of negative resistance amplifier devices commonly possessed by said resonator are superimposed in the same phase and thus to realize a microwave and millimeter wave oscillator that radiates a beam output.

According to the beam oscillator for microwave and millimeter wave of the aforesaid configuration, moreover, it is possible to realize a beam oscillator for microwave and millimeter wave which varies the oscillating frequency by mechanically or electrically varying the resonant frequency of said resonator.

The other objects and characteristic features of the invention will become apparent from the description of the invention given hereinbelow witch reference to the accompanying drawings.

DESCRIPTION OF THE PREFERRED EMBODIMENT

Figure 1:
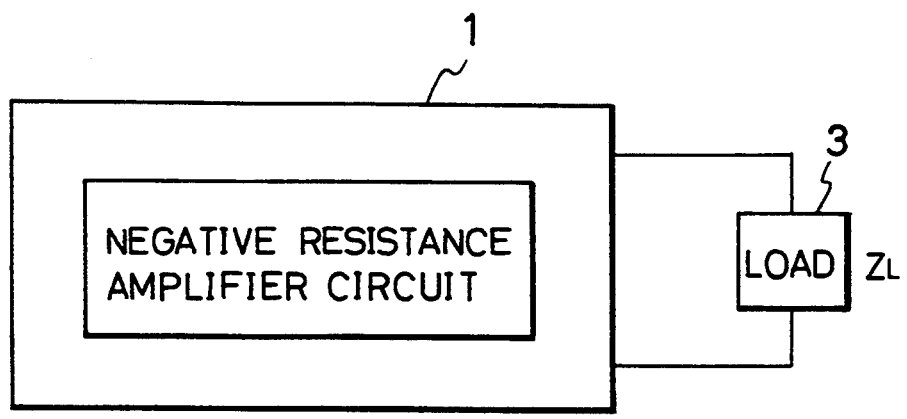
FIG. 1 is an explanatory view showing one example of the configuration of a prior art oscillator.

For clarifying the configurational characteristics of the beam oscillator for microwave and millimeter wave of the present invention an overview of the constitution of the oscillator will be elucidated. FIG. 1 is a view showing an outline of one example of the configuration of a prior art oscillator, wherein a resonator 1 incorporates a negative resistance amplifier circuit 2 and a load 3 represented as an impedance $Z_L$ represents the amount of additional loss caused by extraction of the oscillation power to the resonator exterior. Among those represented by this configuration example is the laser oscillator having an amplification medium inside its resonator.

Figure 2:
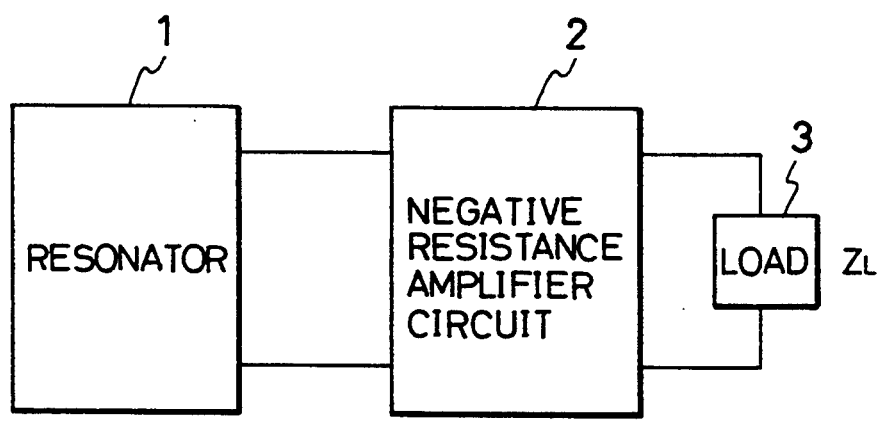
FIG. 2 is an explanatory view showing another example of the configuration of a prior art oscillator.

FIG. 2 is a view showing an outline of another example of the configuration of a prior art oscillator illustrating the case where a resonator 1 is connected with a negative resistance amplifier circuit 2, the load 3 is attached to other terminals of the negative resistance amplifier circuit 2, and the oscillation power is extracted from a port separate of the resonator 1. This is an oscillator configuration widely used in portable telecommunication devices in the microwave and lower frequency range and the resonator 1 incorporates a high dielectric constant, compact dielectric resonator.

Figure 3:
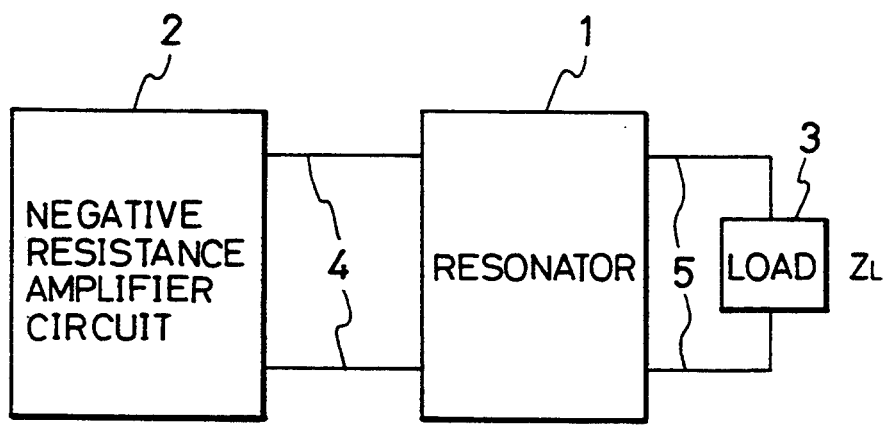
FIG. 3 is a schematic explanatory view of the configuration of a beam oscillator for microwave and millimeter wave according to the present invention.

FIG. 3 is a view most simply representing the configuration of the oscillator of the present invention, wherein a resonator 1 and a negative resistance amplifier circuit 2 are connected by a wave path 4 and a load 3 represented as an impedance $Z_L$ represents the amount of additional loss caused by extraction of the oscillation power to the resonator exterior as a beam 5.

In the oscillators of FIGS. 1~3, the gain of the negative resistance amplifier circuit 2 as seen from the side of the resonator 1 can be represented as negative resistance $(-r)$. The condition for oscillation to start is that the gain of the negative resistance amplifier circuit be higher than the loss of the load, i.e., that $r > \text{Re}(Z_L)$. In the steady state of the oscillation, the gain and loss are in balance and the negative resistance amplifier circuit 2 supplies/replenishes the power consumed by the load 3 at this time.

Figure 4:
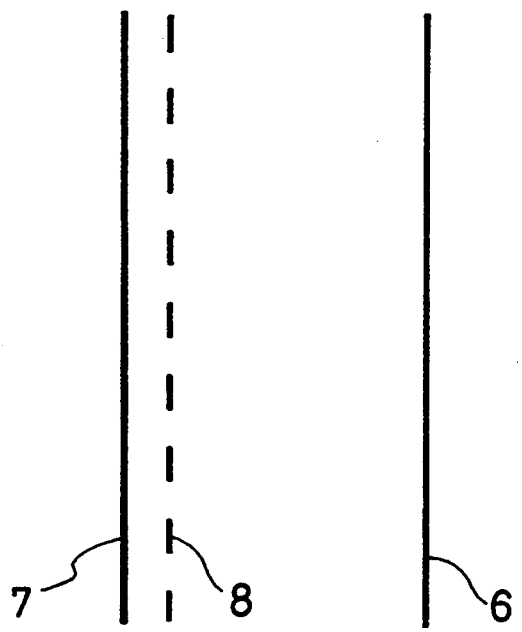
FIG. 4 is an explanatory view showing a prior art power combining-type oscillator in which a two-dimensional array of negative resistance amplifier devices is disposed in the interior of a plane-parallel resonator.

Experiments regarding microwave and millimeter wave oscillators using quasi-optical resonators are being conducted as research regarding power combining in the oscillator of the configuration shown in FIG. 1. FIG. 4 shows an example of an experiment by Rutledge et al. (Z. B. Popovic, M. Kim, D. B. Rutledge, Inter. J. of Infrared and Millimeter Waves, Vol. 9, pp. 647–654, 1988), of a configuration wherein a two-dimensional array of negative resistance amplifier devices 8 is disposed in the interior of a plane-parallel resonator comprising a partially transparent planar mirror 6 and a planar reflecting mirror 7, the amplitude of the signal being amplified with each passage through the two-dimensional array of negative resistance amplifier devices 8, the oscillation state being assumed when the phase difference caused by reflection between the two mirror surfaces becomes equal to an integral multiple of $\pi$, and the synthesized oscillator output is radiated from the partially transparent planar mirror 6.

In addition, as research regarding power combining technology by a Fabry-Perot resonator using spherical reflecting mirrors, there are the experiments using a grooved mirror (mirror surface obtained by parallel groove processing of a metallic mirror) by Mizuno et al. (see FIG. 5; J. Bae, Y. Aburakawa, H. Kondo, T. Tanaka, and K. Mizuno, IEEE Trans. Microwave Theory and Techniques vol. 41, pp 1851–1855, 1993) and the experiment by Frayne et al. in which an array of integral patch antennas integral with an oscillation device were disposed inside a resonator (see FIG. 6).

Figure 5:
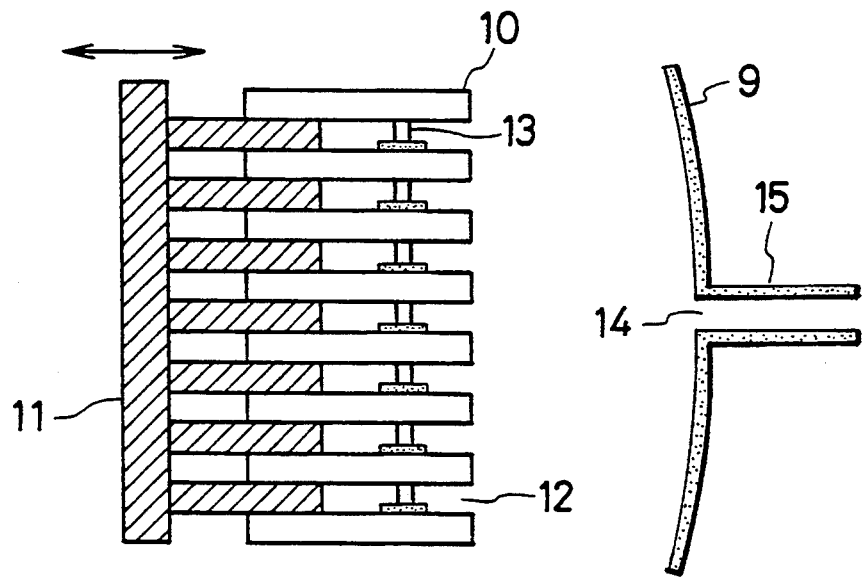
FIG. 5 is an explanatory view showing a prior art power combining type oscillator based on a combination of a spherical reflecting mirror and a grooved mirror.

In the resonator of the oscillator of the configuration of FIG. 5, a grooved mirror consisting of a fixed reflecting portion 10 and a movable reflecting portion 11 is disposed facing a spherical reflecting mirror 9, negative resistance amplifier devices 13 are mounted in groove regions 12, oscillation is caused by adjusting the interval between the spherical reflecting mirror 9 and the fixed reflecting portion 10 and the position of the movable reflecting portion 11, and the power-combining energy in the resonator is extracted to a waveguide 15 from a coupling aperture 14.

Figure 6:
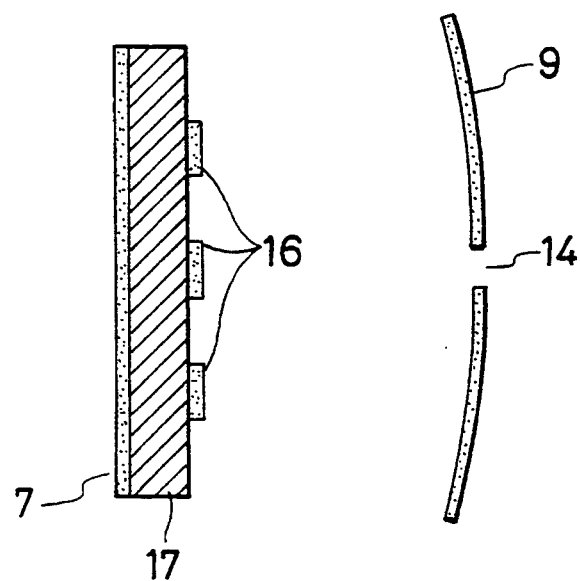
FIG. 6 is an explanatory view showing a prior art power combining type oscillator constituted by a spherical reflecting mirror and a planar reflecting mirror.

The resonator of the oscillator of the configuration of FIG. 6 is formed by a spherical reflecting mirror 9 and a planar reflecting mirror 7 overlaid with the ground conductor surfaces of an array of patch antennas integrated with negative resistance amplifier devices, the negative resistance amplifier circuit 2 utilizes a Gunn diode, and the power-synthesized high-frequency wave power inside the resonator is extracted through a coupling aperture 14. (P. G. Fragne, and J. Potter, Electronics Letters vol. 26, p2070, 1990).

Thus in the oscillator utilizing a quasi-optical resonator, since the negative resistance amplifier circuit 2 is disposed inside a resonator 1 such as shown in FIG. 1 irrespective of whether it is of the beam output type or the waveguide output type, integration or connection with auxiliary circuits is problematic in the case where electrical telecommunication technology or measurement technology application is considered, making necessary a new oscillator configuration that gives consideration to integration with microwave and millimeter wave integrated circuits.

As shown in FIG. 3, in the beam oscillator for microwave and millimeter wave according to this invention, the negative resistance amplifier circuit 2 is located outside the resonator 1 in the fundamental configuration, the two are mutually connected by the wave path 4, and the configuration is such that the oscillation output is extracted from the resonator 1 as the beam 5, with this loss component being represented as the load 3.

The beam oscillator for microwave and millimeter wave according to this invention can by its principle be combined with various types of the negative resistance amplifier circuit 2; specific embodiments will be described in the following.

Figure 7:
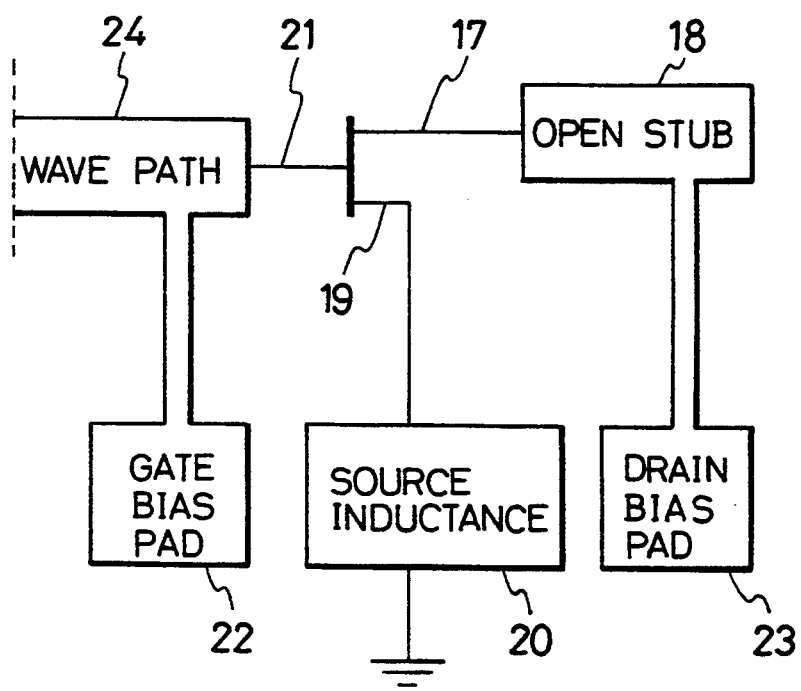
FIG. 7 is an explanatory view showing an example of the planar circuit configuration of a prior art negative resistance amplifier circuit.

The negative resistance is fundamentally required for producing oscillation and the negative resistance amplifier circuit 2 can be configured using such microwave and millimeter wave transistor devices as a field effect transistor (FET), high electron mobility transistor (HEMT), a hetrobipolar transistor (HBT) or the like. FIG. 7 is a view showing an embodiment of the negative resistance amplifier circuit 2 fabricated using an HEMT and employed in a test of the beam oscillator for microwave and millimeter wave according to this invention, wherein a package HEMT (Fujitsu FHX35LG) was used for X-band oscillation and a chip HEMT (Fujitsu FHR10X) was used for Ka-band oscillation.

Owing to a one-end-open stub 18 on the drain 17 side and a source inductance 20 on the source 19 side, the impedance when the device is viewed from the gate 21 side has negative resistance. The gate bias pad 22 and the drain bias pad 23 are for supplying direct current bias to the HEMT and are connected to the resonator 1 by a wave path 24. Although FIG. 7 is a planar circuit constituted as a microstrip line, a negative resistance amplifier circuit 2 based on a coplanar line can be similarly used.

Figure 8:
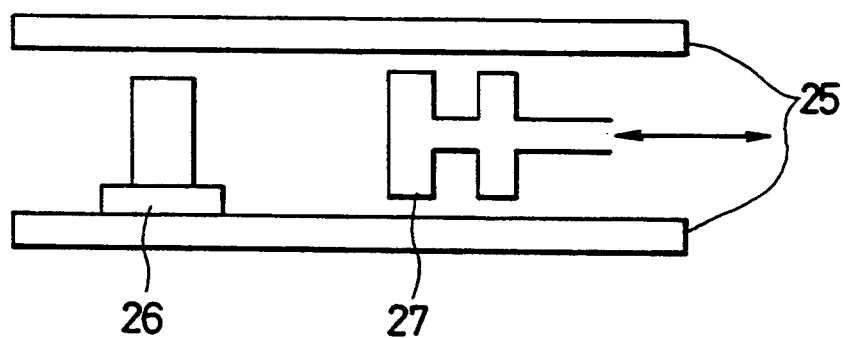
FIG. 8 is an explanatory view showing an example of a prior art negative resistance amplifier circuit employing a negative resistance diode.

Moreover, the negative resistance amplifier circuit 2 required for configuring the oscillator can be realized by using a negative resistance two terminal device (diode) such as a Gunn diode, Impatt diode, Esaki diode or the like. FIG. 8 is a view showing a configuration in the case where a negative resistance diode 26 is mounted in a waveguide 25, wherein 27 is the post of a negative resistance diode and negative resistance is produced by direct current bias applied to the diode (omitted from FIG. 8) and adjustment of a movable short plate (back short) 28, the configuration being usable as the negative resistance amplifier circuit connected with the resonator 1 of the beam oscillator for microwave and millimeter wave according to this invention. Although the case of a waveguide mount is shown here, as the mount and wave path of the negative resistance diode 26 the cases of combination with not only a coaxial mount but also a strip line or coplanar line are of course also possible.

Further, one of the inventors of the present invention has discovered that a weakly superconductor coupled SNS (or SS'S) type Josephson device exhibits a pronounced amplifying effect in the negative resistance region produced based on the Andreef reflection in the region of rise from the zero voltage-current region to the finite voltage region (Japanese Patent Public Disclosure Hei 6-53762), and since it is possible to realize a negative resistance amplifier by biasing a superconducting weak-coupled Josephson device with a voltage bias (Japanese Patent Public Disclosure Sho 63-163517), as the negative resistance amplifier circuit 2 connected with the high-Q-value resonator 1 for configuring the beam oscillator according to this invention it is possible to combine a superconducting weak-coupled Josephson device and a voltage source bias circuit.

Next, specific embodiments of the resonator of the beam oscillator for microwave and millimeter wave according to this invention, including the input/output sections, will be described in detail.

Figure 9:
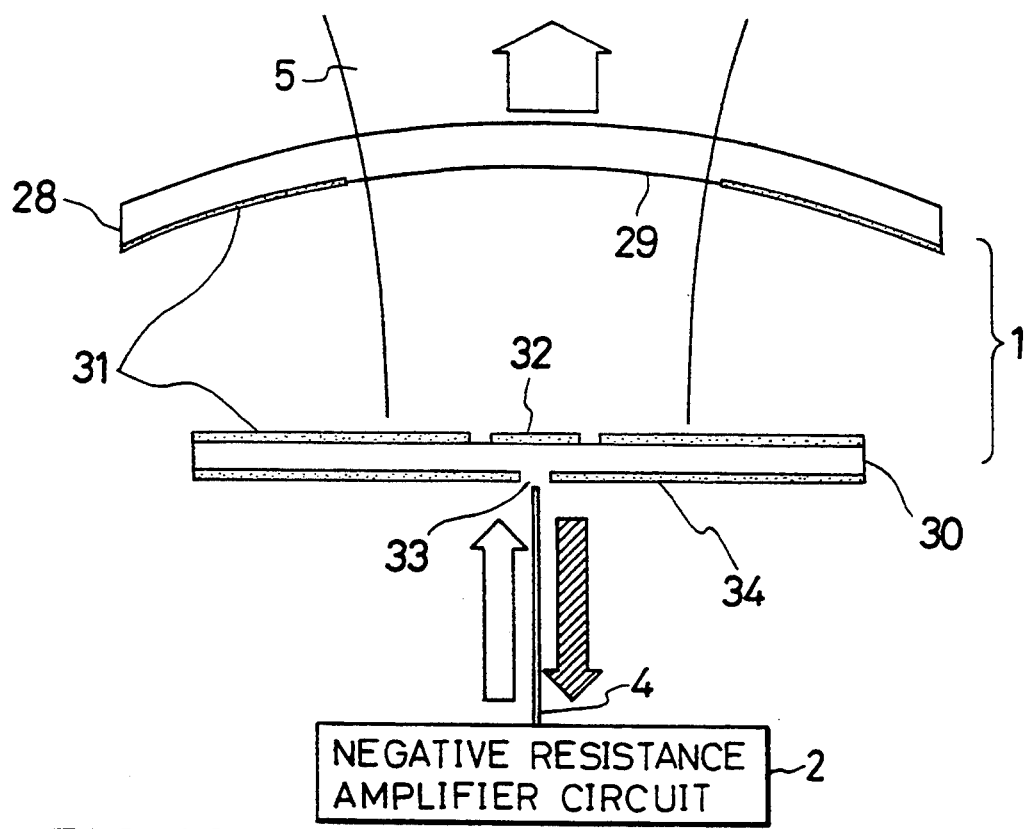
FIG. 9 is an explanatory view showing an embodiment of the beam oscillator for microwave and millimeter wave according to the present invention in which the resonator comprises a planar mirror and a spherical mirror.

The beam oscillator for microwave and millimeter wave according to this invention comprises a Fabry-Perot resonator in which a pair of reflecting mirrors consisting of a spherical mirror and a planar mirror or two spherical mirrors are disposed to face each other such that the waves reflected from the two mirror surfaces repeatedly superimpose. FIG. 9 is a view showing one configuration of the beam oscillator for microwave and millimeter wave according to this invention. A spherical reflecting mirror 28 is provided on its mirror surface with a partially transparent mirror surface region 29, a planar reflecting mirror 30 disposed to face it has a metallic reflecting mirror surface 31, a strip element 32 which constitutes a part of the reflecting mirror 30, and a coupling region 33 on the rear surface of the strip element 32 for coupling with a high-frequency signal wave path, the remaining portion of the back surface being constituted as a conductive surface 34. A wave path mode signal 35 from the negative resistance amplifier circuit 2 is transmitted on the wave path 4, radiated into the resonator from the coupling region 33 through the coupling region 33, or the energy inside the resonator is transformed into a wave path mode signal 35 through the strip element 32 and the coupling region 33. When the frequency of the high-frequency signal entering the resonator through the partially transparent mirror surface region 29 or the strip element 32 is equal to the resonant frequency of the Fabry-Perot resonator, the waves repeatedly reflected between the pair of reflecting mirrors assume a phase difference that is an integral multiple of $2\pi$, the waves reflected from the two mirror surfaces repeatedly superimpose, a stable electric field distribution is formed along the axis by the light condensing action of the spherical mirror 1, high-frequency wave energy is accumulated, and a part thereof is radiated as a beam output 36.

Figure 10:
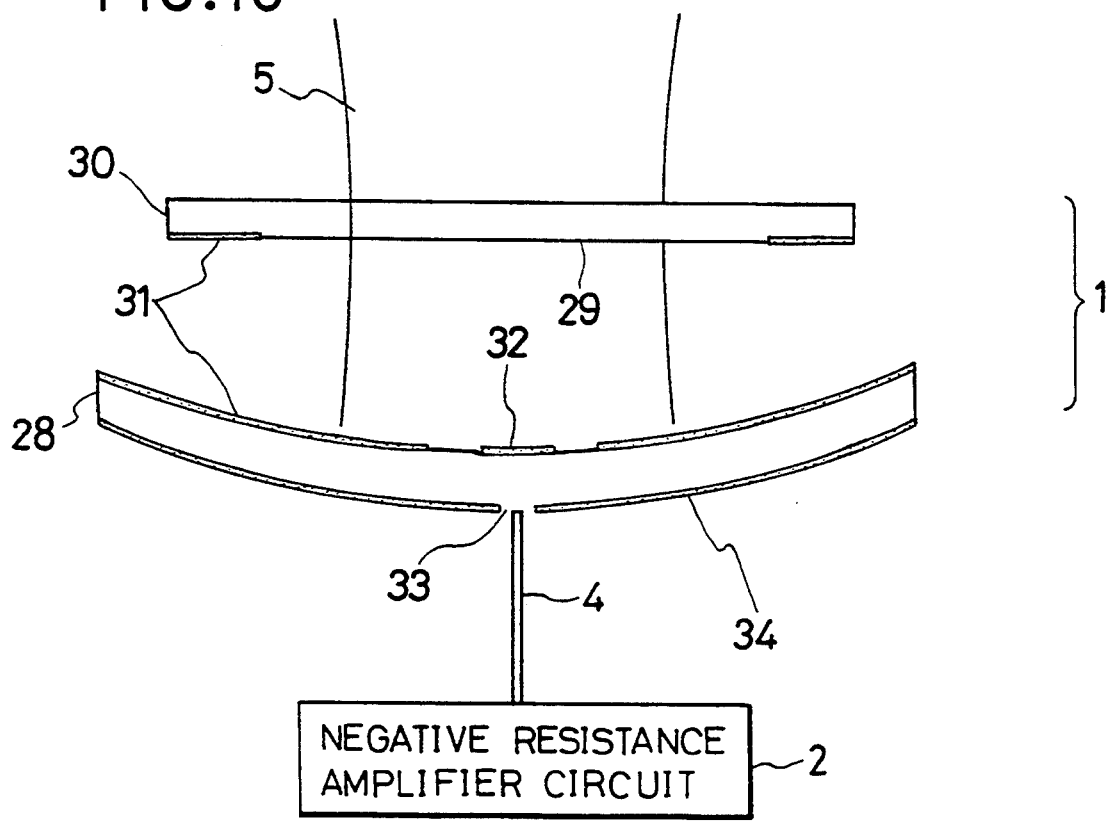
FIG. 10 is an explanatory view showing another embodiment of the beam oscillator for microwave and millimeter wave according to the present invention in which the resonator comprises a planar mirror and a spherical mirror.
Figure 11:
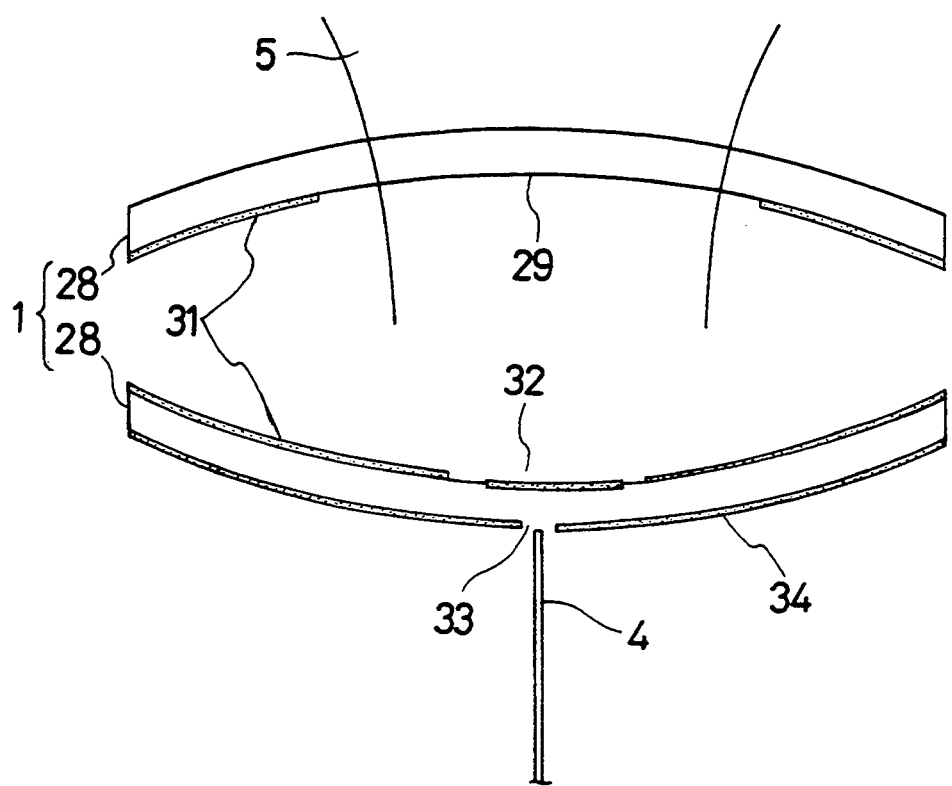
FIG. 11 is an explanatory view showing an embodiment of the beam oscillator for microwave and millimeter wave according to the present invention in which the resonator comprises two spherical mirrors.
Figure 12:
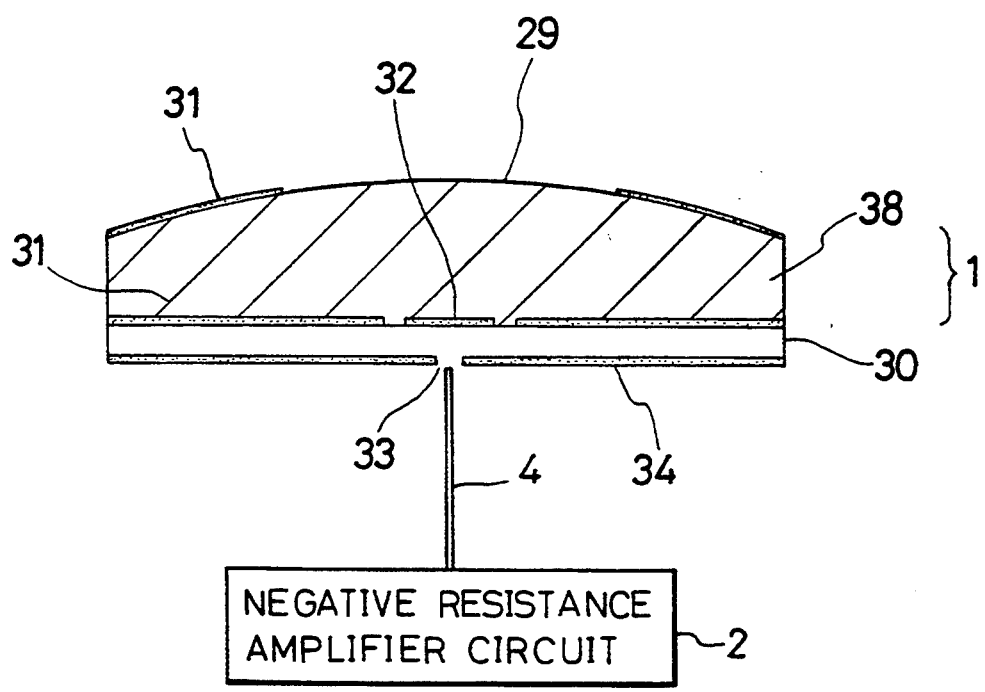
FIG. 12 is an explanatory view showing still another embodiment of the beam oscillator for microwave and millimeter wave according to the present invention.
Figure 13:
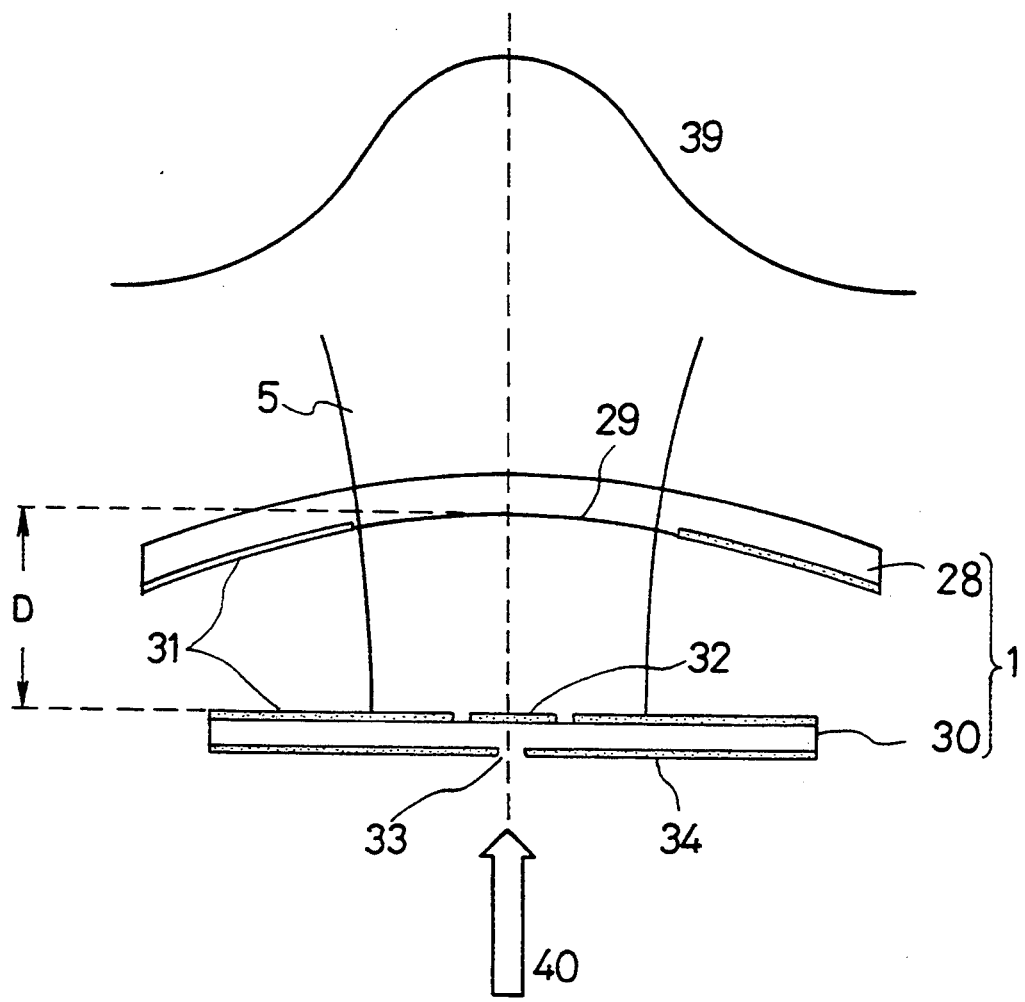
FIG. 13 is an explanatory view schematically showing the power distribution the apertured surface of a beam oscillator for microwave and millimeter wave according to the present invention.

FIG. 10 is a view showing another configuration of the aforesaid spherical reflecting mirror 28 and planar reflecting mirror 30 in which the roles of the mirror surfaces are interchanged. FIG. 11 is a view showing a configuration in which the beam oscillator for microwave and millimeter wave according to this invention comprises two spherical reflecting mirrors 28, 37. Further, FIG. 12 is a view showing a structure equivalent to one in which a low-loss dielectric 38 is charged between the reflecting mirrors of the beam oscillator for microwave and millimeter wave according to this invention. In the configuration of FIG. 12, all or part of the partially transparent mirror surface region 29, metallic reflecting mirror surface 31 and strip element 32 can be formed integrally on the surface of the low-loss dielectric 38 by metal plating, vapor deposition, sputtering or other vacuum film forming method, or by galvanizing or the like. The distribution of the electromagnetic wave energy accumulated in the interior of the beam oscillator for microwave and millimeter wave according to this invention is a Gaussian-beam that is high at the center axis in the direction of electromagnetic wave propagation and decreases rapidly with separation from such axis (fundamental mode $TEM_{00q}$; q being an integer indicating the longitudinal mode number). FIG. 13 shows the schematically represented apertured surface power distribution 39 of the beam oscillator for microwave and millimeter wave according to this invention. At the region of the coupling region 33 coupling with the wave path and the strip element 32, the mode 40 in the wave path is converted to the fundamental Gaussian mode 41 of the resonator interior. One reflecting mirror constituting the beam oscillator for microwave and millimeter wave may be either a planar mirror or a spherical mirror and, as shown in FIGS. 9~11, it suffices for one to be a spherical mirror.

As the circular partially transparent mirror surface region 29 constituting the electromagnetic wave coupling region for coupling with free space, the surface of the reflecting mirror on the side for extracting the electromagnetic wave energy accumulated inside the resonator as a beam is provided with a reflective mirror surface consisting of a grid-like conductor pattern that is fine in comparison with the wavelength. As a result of research by the inventors, it was experimentally validated that with a reflective mirror surface such as the foregoing the slight transmittance of the mirror surface possessing high reflectance can be selectively adjusted by varying the dimensions of the conductor pattern (U.S. Pat. No. 5,012,212). The electromagnetic wave energy accumulated inside the resonator is radiated through this partially transparent mirror surface region into free space as a Gaussian beam or as a beam in the form of a part thereof being released from the mirror surface region.

In the case where the reflective mirror surface is a smooth mirror surface made of a metallic conductor with high conductivity such as high-purity copper or aluminum, or gold or silver, the mirror surface reflection loss owing to surface resistive loss can be achieved at less than around 0.1~0.2% in the short millimeter wave region. Further, when the mirror surface of the reflecting mirror is constituted of a Nb, NbN or other metallic superconducting thin film or of a yttrium, bismuth or thallium oxide superconductor, an oscillator with even a higher Q value can be realized in the frequency range in which the surface resistive loss is smaller than a metallic surface with respect to the electromagnetic waves for which the oscillator is used, so that there can be realized an oscillator of high spectral purity. By using these high-quality mirror surface materials and applying thin-film microprocessing techniques it is possible to realize a partially transparent mirror surface 29 with high efficiency extending to the submillimeter wave region.

Figure 14A:
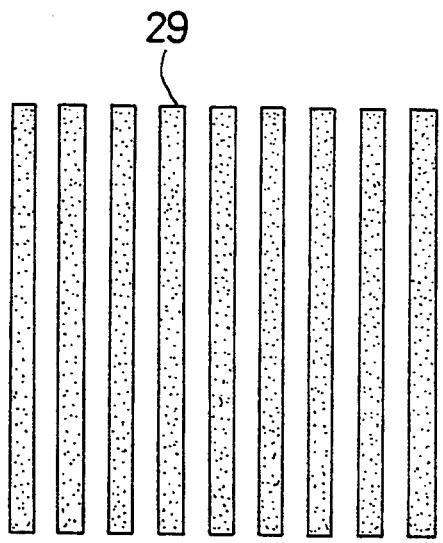
FIG. 14(a) is a view schematically showing a metallic grid pattern forming a partially transparent mirror surface region provided on one reflective mirror surface of the beam oscillator for microwave and millimeter wave according to the present invention.
Figure 14B:
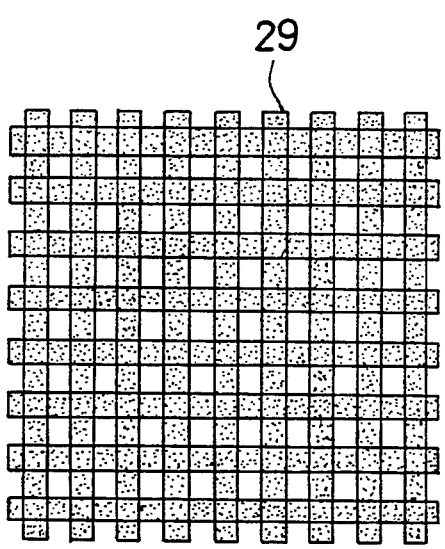
FIG. 14(b) is a view showing another pattern of the partially transparent mirror surface region of FIG. 14(a).

With regard to the partially transparent mirror surface region 29 of the beam oscillator for microwave and millimeter wave according to this invention, for obtaining a high radiation efficiency it is necessary to suppress the absorption loss in mirror surface transmission to a small amount. The effect of transmission absorption at the metallic grid can be made small and there can be realized a resonator with a high Q value owing to the high efficiency of the partially transparent mirror surface region 29, by using a good quality metallic mirror surface possessing high conductivity as the raw material, holding the effect of loss owing to finite high-frequency wave surface resistance to the minimum and selecting the grid pattern of the metallic film provided on the partially transparent mirror surface region 29 at a size in the range of a spatial period of about 1/10~1/100 the wavelength, thereby designing such that the effect of the release of the electromagnetic waves from the metallic grid region is governed by the reflectance and using the mirror surface region as one having a transmittance of 1~2 percent. FIG. 14 is a view schematically showing metallic grid patterns forming the partially transparent electromagnetic wave coupling region 29. The concept of a one-dimensional grid pattern 42 and a two-dimensional grid pattern 43 are shown, it of course being possible to use modifications of these which involve increase/decrease in the ratio between the conductors and gaps or involve other changes in shape.

In the case where the interaction with the negative resistance amplifier circuit is considered, the beam oscillator for microwave and millimeter wave according to this invention can be viewed as a resonator having two ports. In a Fabry-Perot resonator configured of a pair of concave spherical reflecting mirrors or of a concave spherical reflecting mirror and a planar mirror in the foregoing manner, the effect of the diffractive loss that leaks from the edges of the reflecting mirrors and is lost to the exterior of the resonator at the time of repeatedly reflecting between the mirror surfaces can, by making the opening diameter of the reflecting mirror large, be set at a minute amount that is relatively negligible in comparison with losses accompanying the mirror reflection.

$Q_L$, the resonator Q value in the case where the diffraction loss is negligible, is given by Eq. (1).

$$\frac{1}{Q_L} = \frac{1}{Q_0} + \frac{1}{Q_1} + \frac{1}{Q_2} \quad (1)$$

$Q_0$ here is the unloaded Q corresponding to the surface resistive loss accompanying the formation of the two reflective mirror surfaces forming the resonator of conductor surfaces possessing finite conductivity while, on the other hand, in the case where a coupling region is provided on the reflective mirror surface for extracting energy inside the resonator to the exterior, the extraction of the signal through the coupling region is itself a loss of accumulated electromagnetic wave energy as viewed from the interior of the resonator, $Q_1$ is the Q value corresponding to the amount of increase in loss owing to the provision of the coupling region 33 provided between the strip element 32 and the wave path 4, and $Q_2$ is the Q value corresponding to the amount of increase in loss owing to the provision of the coupling region with space based on the partially transparent mirror surface region 29.

Defining the coupling coefficient of the reflective mirror surface provided on the strip element 32 as $\beta_1$ and the coupling coefficient of the reflective mirror surface provided on the partially transparent mirror surface region 29 as $\beta_2$, it follows that $\beta_1=Q_0/Q_1$, $\beta_2=Q_0/Q_2$. In the beam oscillator for microwave and millimeter wave according to this invention, it is necessary to set the mirror surface reflectance of the partially transparent mirror surface region 29 which radiates the oscillation output high, i.e., to select $Q_2$ large, to, in contrast set the transmittance of the reflective mirror surface provided on the strip element 32 connected with the negative resistance amplifier circuit 2 by the wave path 4 relatively high, and, for producing stable oscillation, to make the resonator coupling as seen from the side of the negative resistance amplifier circuit 2 tight coupling, whereby the value of the load Q, $Q_L$, is governed by the coupling Q value, $Q_1$. $Q_1$, $Q_2$ can be represented using the reflectances $R_1$, $R_2$ of the respective reflective mirror surfaces, as in Eq. (2).

$$Q_k = \frac{4\pi D}{\lambda} \frac{\sqrt{R_k}}{1-R_k} \approx 2\pi(q+1)\frac{\sqrt{R_k}}{(1-R_k)} \quad (2)$$

Here, k=1 and 2, and D is the interval between the reflective mirror surfaces. The resonant frequency of the fundamental mode $TEM_{00q}$ at this time can be represented by Eq. (3).

$$fq = \frac{c}{2D}(q+1+\delta) \quad (3)$$

Here, c is the speed of light in the medium inside the resonator, q=0, 1, 2, ..., and δ is the correction amount owing to the fact that the propagation of the electromagnetic waves inside the resonator is not a planar wave but a Gaussian beam. δ depends on the combination of reflecting mirrors and, for a combination of a planar mirror and a spherical mirror is, $\delta=(\frac{1}{2}\pi)$ arccos $(1-2D/R_0)$, and for a combination of two spherical mirrors is given by, $\delta=(1/\pi)$ arccos $(1-D/R_0)$. $R_0$ here is the radius of curvature of the spherical reflecting mirrors.

δ is ordinarily a small value and the reflective mirror surface interval D is about an integral multiple of ½ the wavelength. Assuming that the mirror surface reflectance of the partially transparent mirror surface region 29 is set at about 99~99.5%, the mirror surface reflectance of the strip element 32 is set a little smaller than this at 97~99%, and the longitudinal mode number inside the resonator is made 1~5 (q=0, 1, 2, 3, 4), $Q_L$ becomes about 300~2500. It increases almost proportionally if the longitudinal mode number is increased. In the case of power combining by a plurality of active elements, moreover, the mirror surface reflectance sufficiently satisfies the oscillation condition at a lower value.

Although the shape and beam spread of the Gaussian beam is shown schematically in FIG. 5, the shape of a fundamental Gaussian beam is generally specified by the minimum spot size $w_0$ and the location thereof. In the beam oscillator for microwave and millimeter wave according to this invention, the minimum spot size $w_0$ can be freely set by appropriately selecting the radius of curvature $R_0$ of the spherical reflecting mirror and the reflective mirror surface interval D. The minimum spot size $w_0$ obtained on a planar reflective mirror surface is given by $$w_0^2 = \frac{\lambda}{\pi}\sqrt{D(R_0-D)} \quad (4)$$

As a widely known diffraction spread relationship, the half-apex angle in the far field of a wave confined in an aperture of radius $w_0$ is given by $$\theta = \tan^{-1}\left(\frac{\lambda}{\pi w_0}\right) \approx \frac{\lambda}{\pi w_0} \quad (5)$$

Thus in the beam oscillator for microwave and millimeter wave according to this invention the output beam radiation pattern can be determined by designing the minimum beam spot size.

Figure 15A:
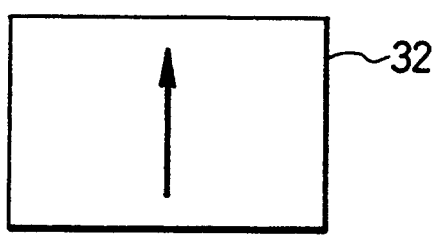
FIG. 15(a) is an explanatory view schematically showing a first embodiment of the form of a strip element constituting a region of the other reflective mirror surface of the beam oscillator for microwave and millimeter wave according to the present invention.
Figure 15B:
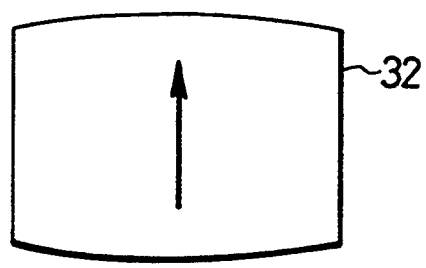
FIG. 15(b) is an explanatory view schematically showing a second embodiment of the form of the aforesaid strip element.
Figure 15C:
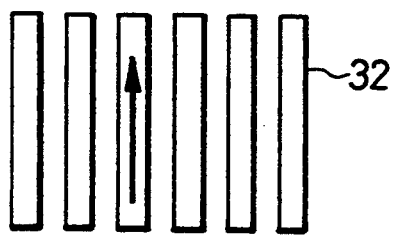
FIG. 15(c) is an explanatory view schematically showing a third embodiment of the form of the aforesaid strip element.
Figure 15D:
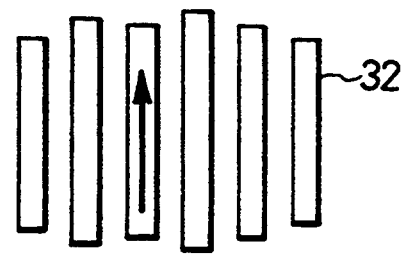
FIG. 15(d) is an explanatory view schematically showing a fourth embodiment of the form of the aforesaid strip element.
Figure 15E:
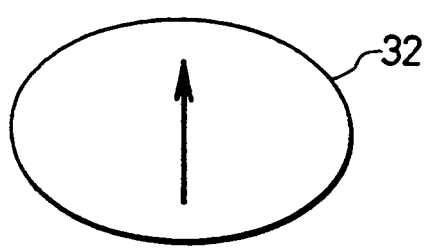
FIG. 15(e) is an explanatory view schematically showing a fifth embodiment of the form of the aforesaid strip element.
Figure 15F:
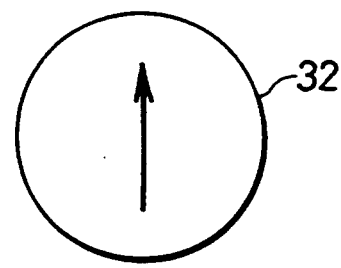
FIG. 15(f) is an explanatory view schematically showing a sixth embodiment of the form of the aforesaid strip element.
Figure 16A:
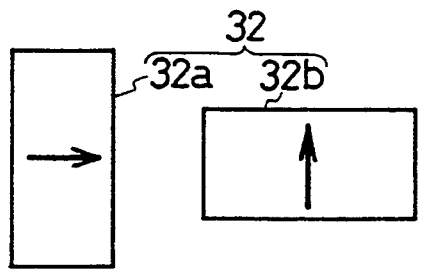
FIG. 16(a) is an explanatory view schematically showing a first embodiment of the form of another strip element constituting a region of the other reflective mirror surface of the beam oscillator for microwave and millimeter wave according to the present invention.
Figure 16B:
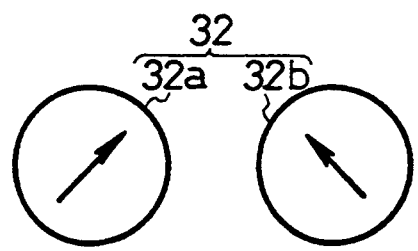
FIG. 16(b) is an explanatory view schematically showing a second embodiment of another form of the strip element of FIG. 16(a).
Figure 16C:
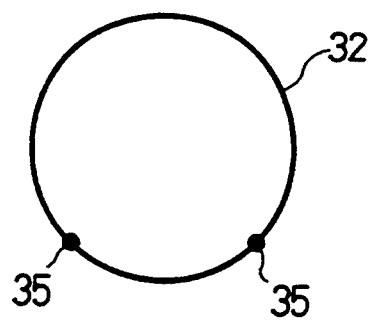
FIG. 16(c) is an explanatory view schematically showing a third embodiment of another form of the strip element of FIG. 16(a).
Figure 16D:
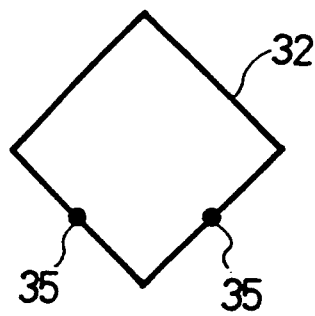
FIG. 16(d) is an explanatory view schematically showing a fourth embodiment of another form of the strip element of FIG. 16(a).
Figure 16E:
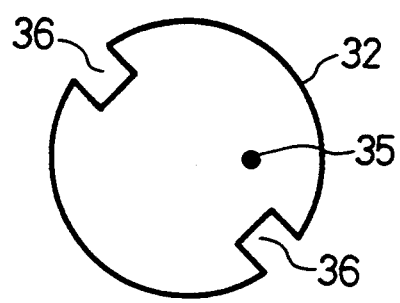
FIG. 16(e) is an explanatory view schematically showing a fifth embodiment of another form of the strip element of FIG. 16(a).
Figure 16F:
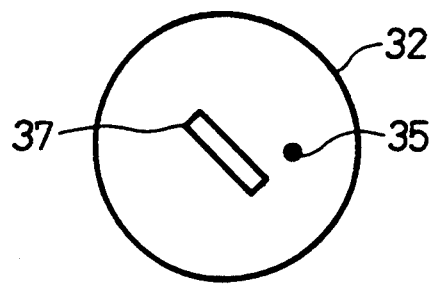
FIG. 16(f) is an explanatory view schematically showing a sixth embodiment of another form of the strip element of FIG. 16(a).
Figure 16G:
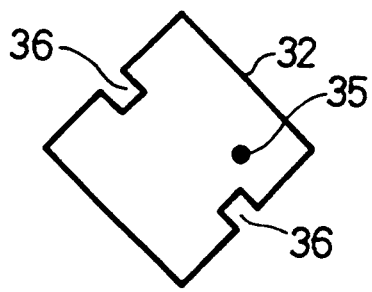
FIG. 16(g) is an explanatory view schematically showing a seventh embodiment of another form of the strip element of FIG. 16(a).
Figure 16H:
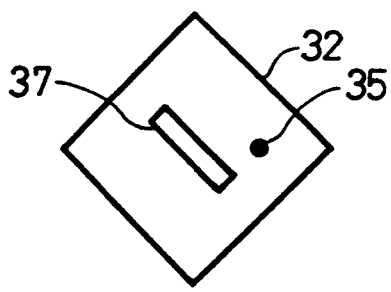
FIG. 16(h) is an explanatory view schematically showing an eighth embodiment of another form of the strip element of FIG. 16(a).

Various types of the strip element 32, which plays an important role in the wave path mode and the resonator mode transformation, will now be discussed. FIG. 15 is a view schematically showing as the strip element 32, which constitutes a part of the metallic reflecting mirror surface 31 of the reflecting mirror 30 provided with the coupling region 33 for coupling with the wave path 4 of the beam oscillator for microwave and millimeter wave according to this invention, various forms that can be applied for use with linearly polarized waves. FIG. 15(a) is the most basic rectangular patch, FIG. 15(b) is a patch modified from the shape of FIG. 15(a) for band broadening, FIG. 15(c) is a conductor grid type, FIG. 15(d) is modified in grid length from FIG. 15(c) for band broadening, and FIG. 15(d) is an elliptical patch which can be expected to have broad band characteristics. These have to be optimized according to the frequency used.

Next, various types of the strip element 32 utilizable when the beam oscillator for microwave and millimeter wave according to this invention is used as a circularly polarized wave output resonator are shown in FIG. 16. FIG. 16(a) is a pair of rectangular patches consisting of 32a, 32b for use with a perpendicularly polarized wave, FIG. 16(b) is similarly a pair of circular patches for use with a perpendicularly polarized wave, FIG. 16(c) is a type that produces a circularly polarized wave by using two power supply points 35 to excite perpendicularly intersecting polarization components and confer a 90-degree phase difference with a single circular patch, and FIG. 16(d) similarly produces a circularly polarized wave by using two power supply points 35 to excite perpendicularly polarized waves with a rectangular patch. Each of FIG. 16(a)~(d) is required to maintain a 90-degree phase difference regarding the perpendicular polarization components. In contrast, FIG. 16(e) is an element which, by providing notches 36 in a circular patch, is devised so that by a single power supply point the current distribution on the patch produces a 90-degree phase difference between perpendicularly intersecting components. In FIG. 16(f), instead of providing the notches 36 a slit 37 is provided and the current distribution on the patch and the phase thereof is controlled by a single power supply point, the patch being devised similarly to FIG. 16(e) for producing a 90-degree phase difference. FIGS. 16(g), (h) are types in which notches 36 or a slit 37 is provided with respect to a square patch similarly to the case of the circular patches of FIGS. 16(e), (f) and a 90-degree phase difference is secured with respect to the perpendicularly intersecting polarization components by selecting the location of a single power supply point. The conductor grid of the electromagnetic wave coupling region 29 for coupling with space constituted as a partially transparent mirror surface region at the center of the reflecting mirror 28 in combination with these strip elements 32 for circularly polarized waves has to be combined with the two-dimensional grid of FIG. 14(b).

Aside from the strip elements shown in FIG. 15 and FIG. 16, it is also possible to use a spiral-like conductor film pattern or the like as the strip element of the conductor reflecting mirror surface 4 of a circularly polarized beam output resonator. In addition, a plurality of any of these strip elements can be disposed on one reflective mirror surface. In the case of a large aperture diameter beam oscillator for microwave and millimeter wave, since the coupling with the wave path becomes relatively weak, feeding at a plurality of points is effective.

Figure 17:
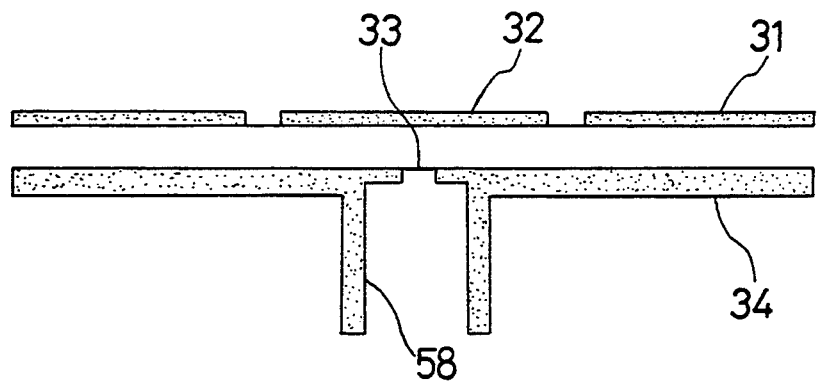
FIG. 17 is an explanatory view schematically showing a coupling region for coupling the beam oscillator for microwave and millimeter wave according to the present invention with a metallic waveguide.
Figure 18:
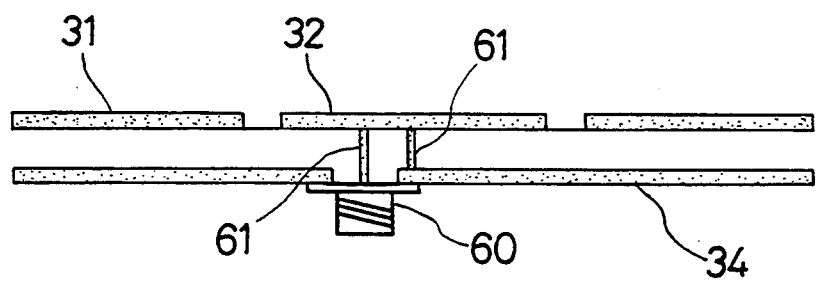
FIG. 18 is an explanatory view schematically showing a coupling region for coupling the beam oscillator for microwave and millimeter wave according to the present invention with a coaxial transmission path.
Figure 19:
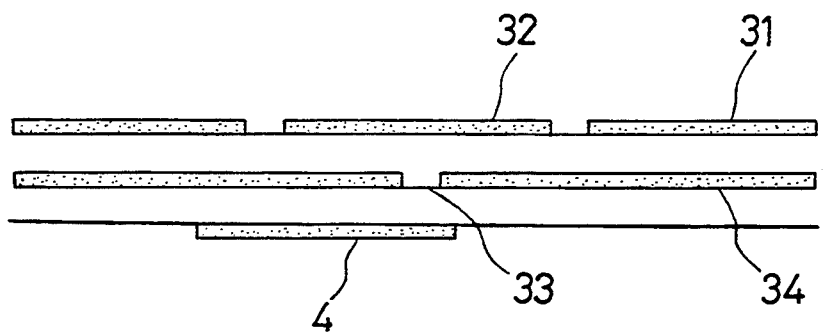
FIG. 19 is an explanatory view schematically showing a coupling region for coupling the beam oscillator for microwave and millimeter wave according to the present invention with a microstrip line.
Figure 20:
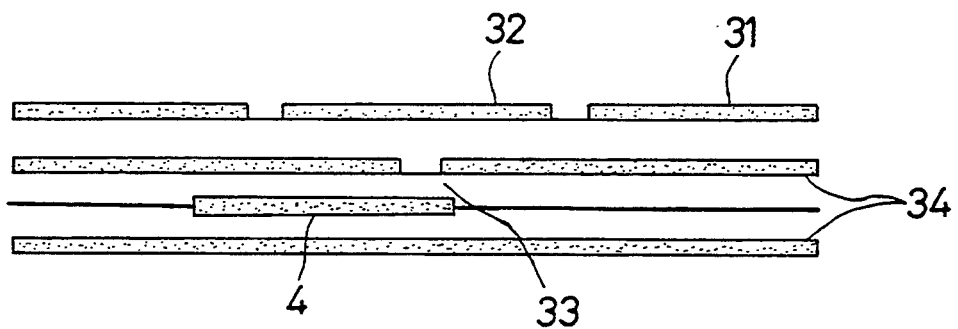
FIG. 20 is an explanatory view schematically showing a coupling region for coupling the beam oscillator for microwave and millimeter wave according to the present invention with a triplate structure.

FIG. 17 is an explanatory view schematically showing an example of a coupling region for coupling with a metallic waveguide 58 of the beam oscillator for microwave and millimeter wave according to this invention, and FIG. 18 is an explanatory view schematically showing an example in which the coupling region is formed by a pin contact 61 in the case where the wave path 4 is a coaxial transmission path 60. Further, FIG. 19 is an explanatory view schematically showing a coupling region 33 for coupling with a wave path 4 that is a microstrip line, and FIG. 20 is an explanatory view schematically showing the coupling region 33 connection configuration when the wave path 4 is a triplate strip line.

Figure 21A:
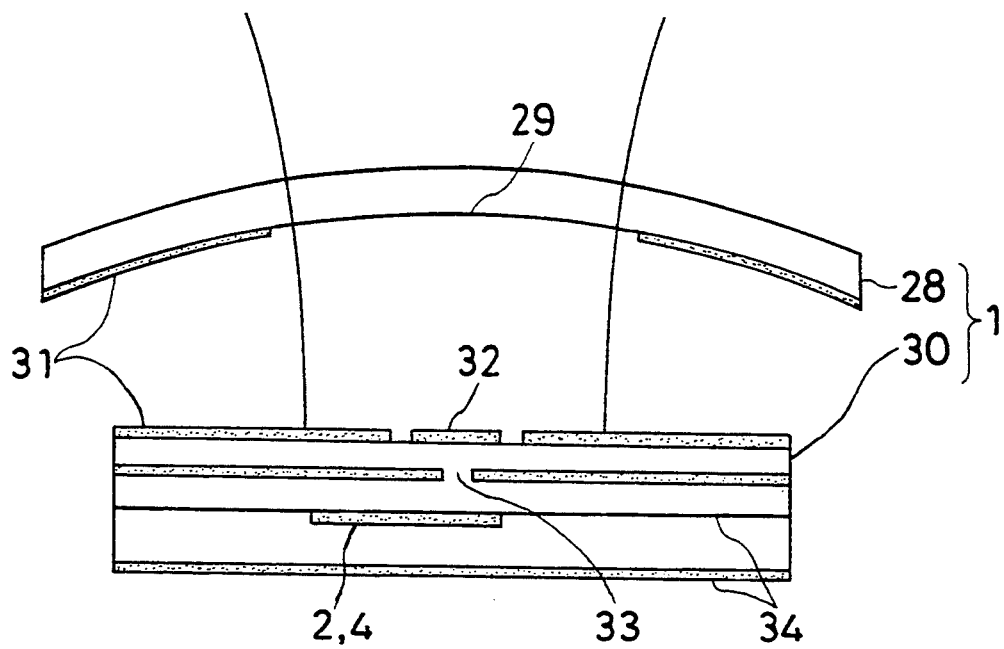
FIGS. 21(a) and 21(b) are explanatory view showing the configuration of an embodiment of the beam oscillator for microwave and millimeter wave according to the present invention based on planar wave path coupling.
Figure 21B:
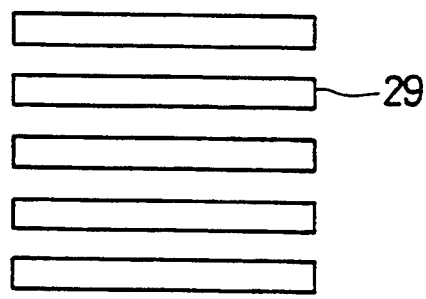

Specific embodiments of the beam oscillator for microwave and millimeter wave according to this invention based on planar wave path coupling will be described here. An overview is shown in FIG. 21. A partially transparent coupling region consisting of a metallic grid is provided on the spherical reflecting mirror surface, thereby forming a reflective mirror surface with a high reflectance and a low transmission absorption loss. For testing in the X-band, a copper-plated Teflon cloth substrate formed to a diameter of 250 mm was used as the spherical mirror; one formed to a spherical surface of a radius of curvature of 1 m is used. The diameter of the partially transparent circular coupling region is 200 mm. Further, in the K-band test a 80 mm φ copper-plated Teflon cloth substrate was used for both the spherical mirror and the planar mirror and each was formed into a spherical mirror using a mold after grid pattern formation. The structural parameters of the reflecting mirrors are summarized and shown in Table 1.

TABLE 1

|  | For X-band | For K-band |
| --- | --- | --- |
| Plane mirror size | 200 × 200 mm | 80 mm φ |
| Spherical mirror diameter | 250 mm | 80 mm φ |
| Spherical mirror radius of curvature | 1000 mm | 700 mm |
| Partially transparent mirror surface region |  |  |
| Diameter | 200 mm | 50 mm |
| Conductor portion line width | 1 mm | 0.35 mm |
| Gap width | 1 mm | 0.45 mm |

For configuring the beam oscillator for microwave and millimeter wave according to this invention, a copper-plated Teflon cloth substrate is used, the rectangular patch shown at 44 in FIG. 7 is used as a microstrip element on the planar reflecting mirror surface and a thin-film slot is formed on the rear surface thereof as the coupling region of the microstrip line wave path. As the active circuit for oscillation, a packaged HEMT (Fujitsu FHX35LG) is used for the X-band and a chip HEMT (Fujitsu FHR10X) is used for the K-band, and the negative resistance oscillation circuit shown in FIG. 7 is used. The impedance when the device is seen from the gate side is made to have negative resistance by a one-end-open stub on the drain side and the source inductance. The small signal S parameter of the device was used in the circuit design. The slot is formed within the ground plane of the gate side.

Figure 22:
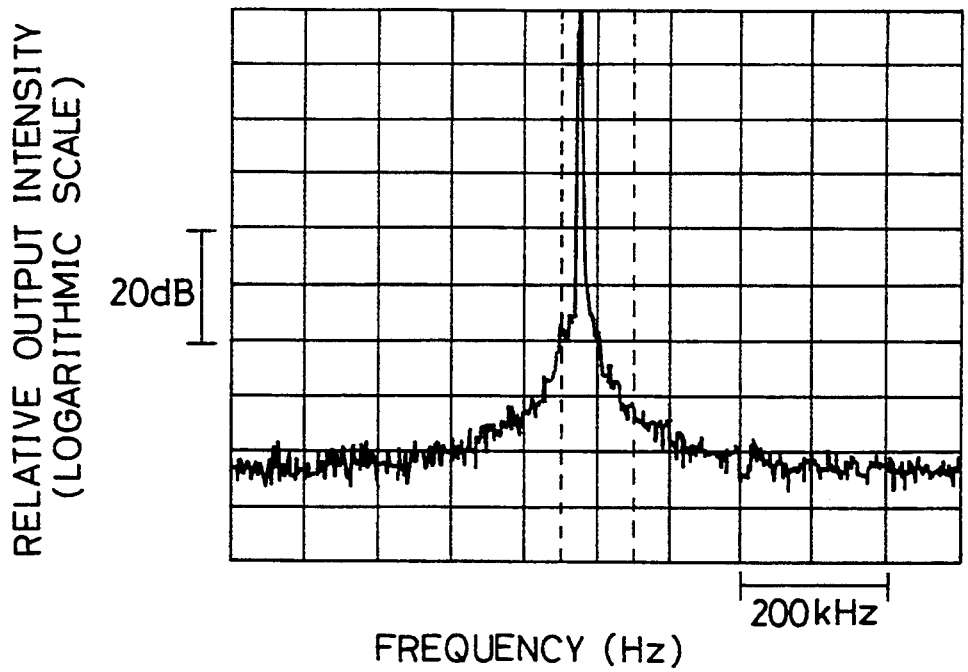
FIG. 22 is a graph showing the X-band (10.2 GHz) oscillation spectral characteristics of an embodiment of the beam oscillator for microwave and millimeter wave based on planar wave path coupling.
Figure 23:
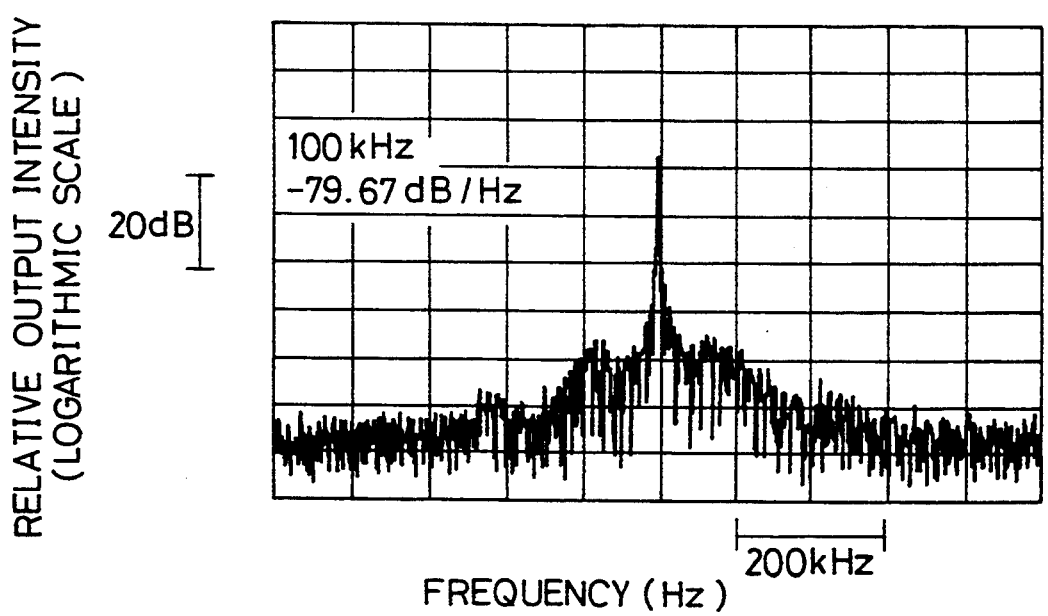
FIG. 23 is a graph showing the K-band (25.5 GH) oscillation spectral characteristics of an embodiment of the beam oscillator for microwave and millimeter wave based on planar wave path coupling.

The oscillation spectrum of the beam oscillator for microwave and millimeter wave according to this invention was measured. FIG. 22 shows an example of the oscillation spectrum in the X-band (10.2 GHz). FIG. 23 further shows the oscillation spectrum in the K-band (25.5 GHz). The oscillation frequency could be adjusted in the range of 1 GHz by mechanically varying the resonator length. Low phase noise characteristics on a par with an oscillator using a dielectric resonator were obtained.

Figure 24:
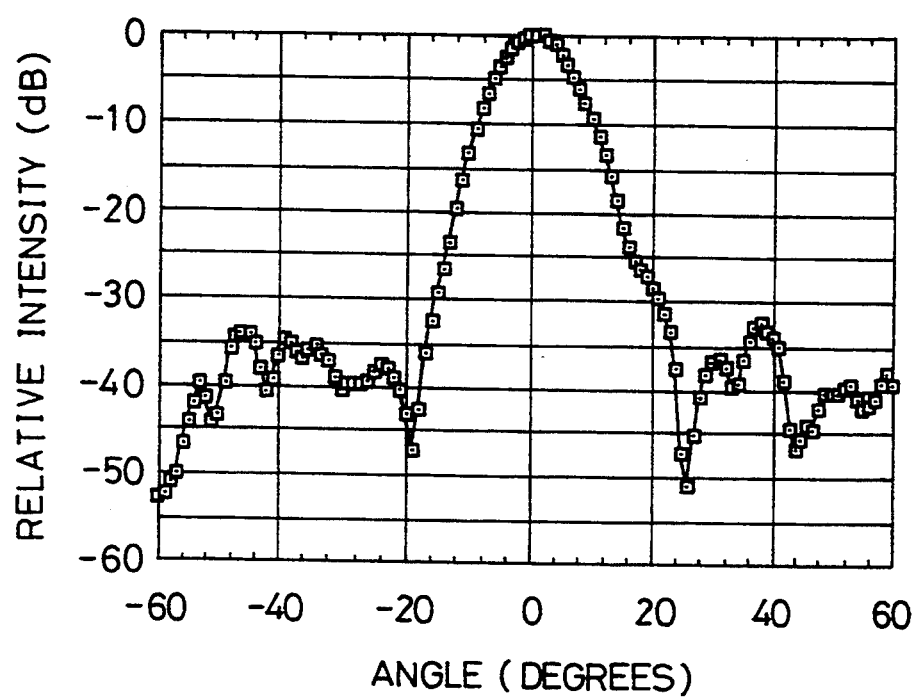
FIG. 24 is a graph showing the beam-output radiation pattern measurement results for an embodiment of the beam oscillator for microwave and millimeter wave according to the present invention.

The measurement of the radiation pattern of the beam oscillator for microwave and millimeter wave according to this invention was conducted in an anechoic chamber. The beam oscillator for microwave and millimeter wave being tested was set as a transmitting antenna on a rotary stage and the angular dependence of the received power of a transmitted signal from a horn antenna was measured as the angle was changed. FIG. 24 shows an example of the measurement results of the beam output radiation pattern at 11.9 GHz, the vertical axis representing relative gain and the horizontal axis rotational angle. In this measurement, the longitudinal mode corresponds to q=5 and the mirror surface interval is about three wavelengths. As a characteristic of a Gaussian beam there is obtained a low sidelobe characteristic. The difference of the theoretical values obtained by substituting the radius of curvature $R_0$ of the spherical mirror, the mirror surface interval D and the value of the wavelength λ into Eq. 4 and Eq. 5 from the results of the antenna pattern measurement values was within measurement error, experimentally validating that a Gaussian beam is formed inside the resonator, extracted from the partially transparent mirror surface region, and radiated as a wave source at the apertured surface with Gaussian intensity distribution. The ratio of the beam spot size to the diameter of the partially transparent mirror surface region on the spherical mirror was 1.9. Similar measurement was also conducted in the case of the K-band and the theoretical values obtained by substituting the parameters in Eq. 4, Eq. 5 and the measured results were within measurement error in this case also. The beam output radiation characteristics are summarized in Table 2.

TABLE 2

| X-band (11.9 GHz) | |
| --- | --- |
| Half-power beam width | 5.2 degrees |
| Beam half-width θ (electric field) | 8.8 degrees |
| Beam spot size $w_0$ (Test value) | 52 mm |
| Aperture ratio $2a/w_0$ | 1.9 |

Figure 25A:
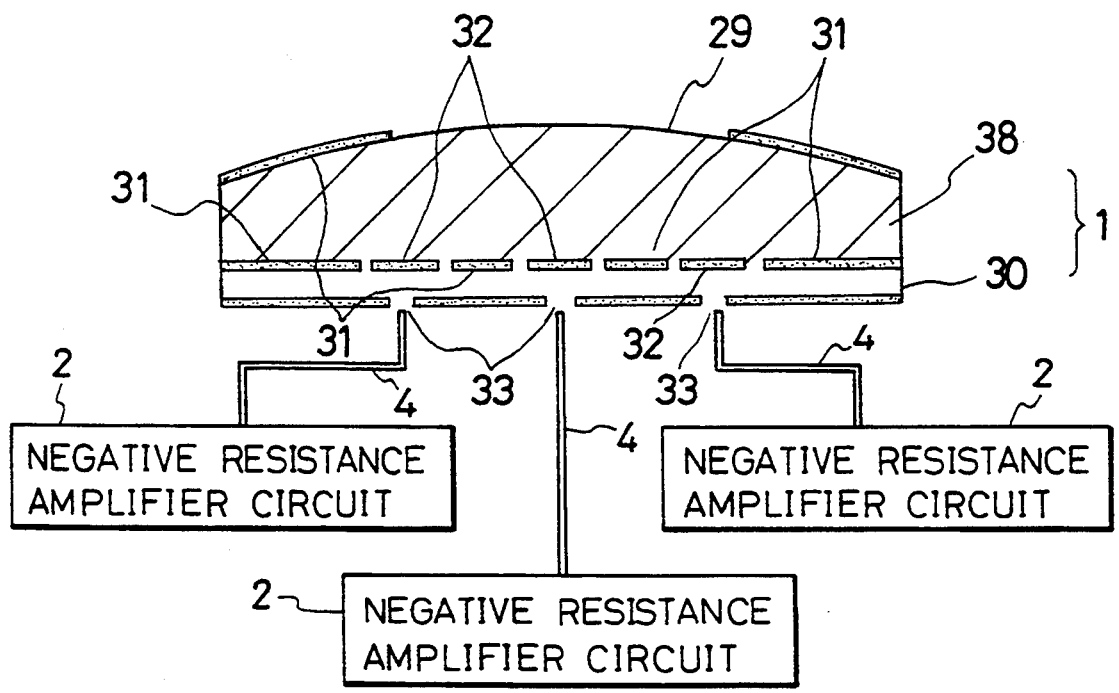
FIG. 25(a) is an explanatory view of the configuration of an oscillator for microwave and millimeter wave according to the present invention employing a plurality of negative resistance amplifier circuits.
Figure 25B:
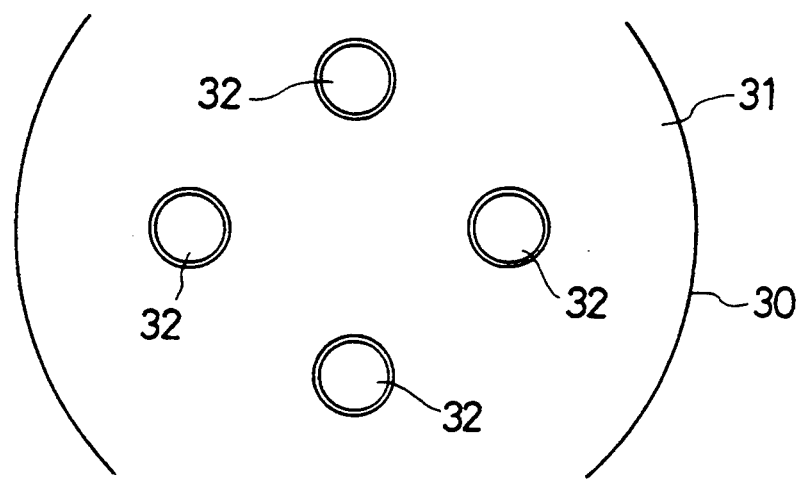
FIG. 25(b) is an explanatory view showing an example of the state of arrangement of the plurality of strip elements in the oscillator of FIG. 25(a).

Next the oscillation operation by power combining for realizing a high output by the beam oscillator for microwave and millimeter wave according to this invention will be explained based on FIG. 25. The oscillator of FIG. 25 shows an embodiment which uses a resonator 1 equivalent to one in which the low-loss dielectric 38 is charged between the reflective mirror surfaces and is oscillated by four negative resistance amplifier circuits synchronized in parallel. As shown in FIG. 25(b), the surface of the metallic reflecting mirror surface 31 of the planar reflecting mirror 30 has four strip elements 32, each has a coupling region 33 for coupling with a wave path 4 which is connected with a negative resistance amplifier circuit 2 and transmits a high-frequency signal, and the electrical lengths relative to the high-frequency signals passing through the wave paths 4 from the respective strip elements 32 and the coupling regions 33 on the rear surfaces thereof and reaching the negative resistance amplifier circuits 2 are all set to produce the same phase difference of an integral multiple of a half wavelength. In the oscillator of FIG. 25, the electromagnetic fields coinciding with the resonant frequency inside the resonator 1 have the same phase at the metallic reflective mirror surface of the planar reflecting mirror 30, high-frequency wave currents of the same phase are induced on all four strip elements 32, owing to the induced high-frequency currents high-frequency signals in the resonator 1 leak from said strip elements 32 through the coupling regions 33 to the wave paths 4 to be transmitted to the negative resistance amplifier circuits 2, since the same phase difference is produced in said high-frequency signals by transmission in the wave paths 4 said high-frequency signals have the same phase at the position of all four negative resistance amplifier circuits 2, are amplified by the negative resistance amplifier circuits 2, are transmitted in the reverse direction in the wave paths 4 having the same electrical lengths again, and pass through the coupling regions 33 to excite high-frequency wave currents of the same phase on the strip elements 32. As a result, high-frequency wave currents that have received the amplifying effect are again induced on all strip elements and are radiated into the interior of the resonator 1 at the same phase to excite the resonator mode with good efficiency. Since the high-frequency signal components coinciding with the resonant frequency of the resonator 1 are superimposed on the electromagnetic field accumulated in the resonator in the same phase, the electromagnetic field amplitude inside the resonator is increased by a positive feedback effect, the amplification gain by the negative resistance decreases with growth of the electromagnetic field amplitude to assume a constant amplitude oscillation state, the high-frequency wave electric power accumulated inside the resonator is released from the circular partially transparent mirror surface region 29 which is provided on the other reflective mirror surface forming said resonator and constitutes a coupling region for coupling with free space and is radiated into space in the form of a Gaussian beam, and since the apertured surface power distribution is selectable between Gaussian and the form with the center portion thereof cut away, it is a microwave and millimeter wave oscillator with low sidelobe characteristics. In accordance with the oscillator of this configuration, since a single resonator is combined with a plurality (four in the case of the present embodiment) of negative resistance amplifier circuits 2 and oscillated in the same phase to divide the power in parallel, in comparison with the case of producing oscillation by combining the resonator 1 with a single negative resistance amplifier circuit 2, the saturation power is greatly increased to increase the high-frequency wave power accumulated inside the resonator and a large oscillation output can be obtained. Most ideally, in theory, with same-phase parallel operation of N oscillator elements, at maximum the power is increased by N squared. In actuality, however, the oscillation output based on a number of imperfect factors is smaller than this. In the short millimeter wave-to-submillimeter wave region where the saturation power that a single element can handle drops sharply owing to miniaturization of an element, oscillator technology based on power combining is particularly important. It should be noted that while an explanation was made regarding the case of incorporating four strip elements and negative resistance amplifier circuits, the number of strip elements and negative resistance amplifier circuits is decided according to the oscillation output of the resonator.

Figure 26:
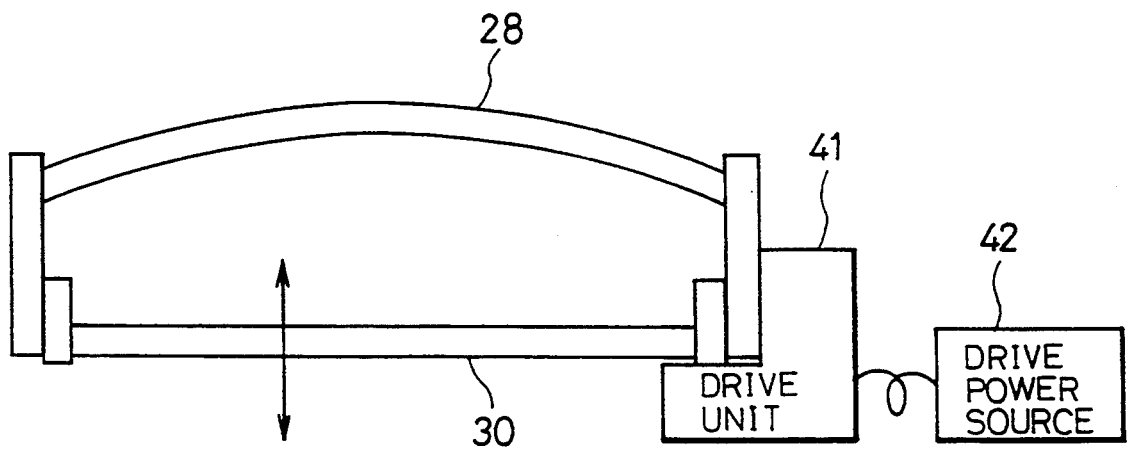
FIG. 26 is an explanatory view showing an embodiment of the beam oscillator for microwave and millimeter wave according to the present invention equipped with mirror surface interval adjustment means.

The oscillation frequency of the beam oscillator for microwave and millimeter wave according to this invention is determined by the resonant frequency of the resonator. FIG. 26 is a conceptual view of a configuration for varying oscillation frequency in which the interval between the reflecting mirrors 28 and 30 constituting the resonator 1 is mechanically varied. Although it is possible to vary the interval between the two reflecting mirrors 28 and 30 constituting the resonator by manual sliding, precision driving by a reflecting mirror drive unit 41 based on a signal from a drive power source 42 is also possible. Said frequency variable system varying the mirror surface interval enables variation of the oscillation frequency over a wide range.

Figure 27:
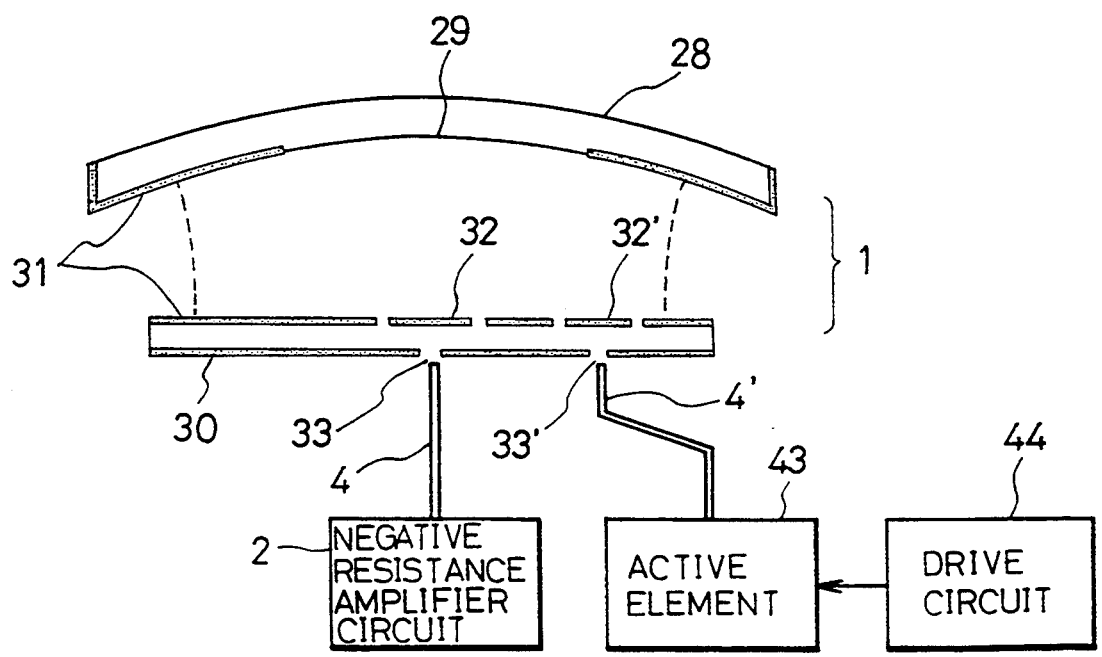
FIG. 27 is an explanatory view showing an embodiment of the beam oscillator for microwave and millimeter wave according to the present invention whose resonant frequency is modulated by loading with an active element.

In contrast, FIG. 27 shows a method enabling rapid electrical variation, although the range of frequency variation is narrow. In this case, by maintaining the resonator 1 interval constant, providing separately of the wave path 4 which transmits a high-frequency signal between the negative resistance amplifier circuit 2 and the strip element 32 via the coupling region 33 another wave path 4' connected with an active element 43 through another strip element 32' and coupling region 33' on the rear thereof, and greatly varying the reactance of the active element by a signal from a drive circuit 44, it is possible to equivalently vary the resonant frequency of the resonator 1 rapidly and vary the oscillation frequency, thus enabling utilization as a frequency modulation method.

By the technology of the beam oscillator for microwave and millimeter wave according to this invention it is possible to realize a new oscillator of high spectral purity which by a high-Q-value resonator that can be used from the microwave to the millimeter wave region and enables extraction of the oscillation output as a beam, and, moreover, is possible to achieve power combining at high efficiency. In addition, this invention has important characteristics in terms of practical technology in that the fact that the oscillation element circuits are located outside the resonator enables easy combination with and efficient operation of the various low-speed~high-speed modulation circuits and auxiliary circuits for control which are indispensable for utilization in communication technology and measurement technology. Realization of a planar transmitter is possible by combination with millimeter wave monolithic integrated circuits (MMIC) and the like.

The present invention is a new microwave and millimeter wave beam oscillator technology developed with an eye to use in the compact, lightweight, practical quasi-planar transmitters/receivers whose realization is expected with the development of millimeter wave integrated circuit technology and has a high probability of being applied in many fields in the development of millimeter wave technology.

What is claimed is:

1. A Gaussian-beam oscillator for microwave and millimeter wave comprising
a negative resistance amplifier circuit which produces and amplifies a high-frequency signal,
a resonator consisting of a pair of reflecting mirrors, which consist of a spherical mirror and a planar mirror or two spherical mirrors, and
a wave path which transmits the high-frequency signal between said resonator and said negative resistance amplifier circuit,
one reflecting mirror of said resonator having an electromagnetic wave coupling region constituted as a circular partially transparent mirror surface region having its center on the optical axis, the other reflecting mirror having a strip element provided at the center of the optical axis and on the rear surface of said strip element having a coupling region for coupling with said wave path, said one reflecting mirror constituting said resonator and having the electromagnetic wave coupling region having a higher reflectance than the reflectance of the other reflecting mirror.

2. An oscillator according to claim 1, wherein the circular partially transparent mirror surface is a reflective mirror surface constituted as a two-dimensional grid-like conductor pattern that is fine in comparison with the wavelength.

3. An oscillator according to claim 1, wherein said coupling region of said other reflecting mirror is connected with two wave path systems and the electrical length between said coupling region and a branch point where the two wave path systems are transformed into a single wave path is the length which creates a 90 degree difference in the phase angle between the high-frequency signals of said two systems.

4. An oscillator according to claim 1, wherein a plurality of strip elements are provided at the center of the optical axis of said other reflecting mirror and the coupling region on the rear surface of each strip element is connected with an aforesaid negative resistance amplifier circuit through said wave path.

5. An oscillator according to claim 1, including one having a structure equivalent to that in which a low-loss dielectric is charged between the pair of reflecting mirrors.

6. An oscillator according to claim 1, wherein said negative resistance amplifier circuit is a circuit using an FET, HEMT and HBT ultra-high frequency transistor device.

7. An oscillator according to claim 1, wherein said negative resistance amplifier circuit is a circuit using a Gunn diode, Impatt diode or Esaki diode negative resistance two terminal device.

8. An oscillator according to claim 1, wherein said negative resistance amplifier circuit consists of superconducting negative resistance device which is a superconducting weak-coupled Josephson device and a voltage bias source.

9. An oscillator according to claim 1, further comprising a second wave path electromagnetically coupled with said resonator and connected with an active element controlled by a drive circuit.

10. An oscillator according to claim 1, wherein the coupling region formed on said one reflecting mirror for coupling with said wave path is a coupling for coupling with a metallic waveguide.

11. An oscillator according to claim 1, wherein the coupling region formed on said one reflecting mirror for coupling with said wave path is a coupling for coupling with a coaxial transmission path.

12. An oscillator according to claim 1, wherein the coupling region formed on said one reflecting mirror for coupling with said wave path is a coupling for coupling with a triplate strip line.

13. An oscillator according to claim 1, wherein the coupling region formed on said one reflecting mirror for coupling with said wave path is a coupling for coupling with a microstrip line.

14. An oscillator according to claim 1, wherein the coupling region formed on said one reflecting mirror for coupling with said wave path is a coupling for coupling with a coplanar line.

15. An oscillator according to claim 1, wherein the mirror surfaces of said pair of reflecting mirrors are formed of copper, aluminum, gold or silver.

16. An oscillator according to claim 1, wherein the mirror surfaces of said pair of reflecting mirrors are formed of Nb, NbN or other metallic superconductor.

17. An oscillator according to claim 1, wherein the mirror surfaces of said pair of reflecting mirrors are formed of yttrium, bismuth or thallium oxide superconductor.

18. An oscillator according to claim 5, wherein said low-loss dielectric is sapphire, quartz, magnesium oxide, silicon, gallium arsenide, olefin, polyethylene, Teflon or aluminum nitride.

19. An oscillator according to claim 1, wherein said pair of reflecting mirrors is equipped with means for adjusting a gap between the reflective mirror surfaces.

* * * * *